US011322472B2

(12) United States Patent
Otsubo et al.

(10) Patent No.: US 11,322,472 B2
(45) Date of Patent: May 3, 2022

(54) MODULE

(71) Applicant: Murata Manufacturing Co., Ltd., Kyoto (JP)

(72) Inventors: Yoshihito Otsubo, Kyoto (JP); Yukio Yamamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 41 days.

(21) Appl. No.: 16/892,352

(22) Filed: Jun. 4, 2020

(65) Prior Publication Data

US 2020/0303336 A1    Sep. 24, 2020

Related U.S. Application Data

(63) Continuation of application No. PCT/JP2018/044498, filed on Dec. 4, 2018.

(30) Foreign Application Priority Data

Dec. 5, 2017   (JP) ............................. JP2017-233390

(51) Int. Cl.
   *H01L 23/552*     (2006.01)
   *H01L 23/00*      (2006.01)
   (Continued)

(52) U.S. Cl.
   CPC .............. *H01L 24/24* (2013.01); *H01L 24/08* (2013.01); *H01L 24/73* (2013.01); *H01L 24/82* (2013.01);
   (Continued)

(58) Field of Classification Search
   None
   See application file for complete search history.

(56) References Cited

U.S. PATENT DOCUMENTS 8,383,457 B2 * 2/2013 Pagaila ................. H01L 25/16
                                                           438/109
2009/0243065 A1   10/2009 Sugino et al.
                    (Continued)

FOREIGN PATENT DOCUMENTS

JP    2010199611 A    9/2010
JP    2014192452 A   10/2014
                (Continued)

OTHER PUBLICATIONS

International Search Report issued in Application No. PCT/JP2018/044498, dated Feb. 5, 2019.
(Continued)

*Primary Examiner* — Hung K Vu
(74) *Attorney, Agent, or Firm* — Pearne & Gordon LLP

(57) ABSTRACT

Provided is a module which has a package-on-package structure including a redistribution layer and can be easily reduced in height. A module 1 includes an upper module including a substrate, a first component, and a sealing resin layer, and a lower module including an intermediate layer and a redistribution layer. The first component is connected to the redistribution layer with a columnar conductor interposed therebetween and provided in the intermediate layer, and both the first component and a second component are rewired by the redistribution layer. Since the intermediate layer is formed by using a frame-shaped substrate, the upper module and the lower module can be connected without necessarily a bump, so that it is possible to provide a module which has a fanout-type package-on-package structure and can be easily reduced in height.

22 Claims, 11 Drawing Sheets

(51) Int. Cl.
*H01L 25/10* (2006.01)
*H01L 25/16* (2006.01)
*H01L 25/18* (2006.01)

(52) U.S. Cl.
CPC ............ *H01L 24/92* (2013.01); *H01L 25/105* (2013.01); *H01L 25/165* (2013.01); *H01L 25/18* (2013.01); *H01L 2224/08225* (2013.01); *H01L 2224/24227* (2013.01); *H01L 2224/73267* (2013.01); *H01L 2224/92244* (2013.01); *H01L 2225/1041* (2013.01)

(56) References Cited

U.S. PATENT DOCUMENTS

| | | |
|---|---|---|
| 2012/0056329 A1 | 3/2012 | Pagaila et al. |
| 2014/0036454 A1 | 2/2014 | Caskey et al. |
| 2014/0291859 A1 | 10/2014 | Kiwanami et al. |
| 2016/0037640 A1 | 2/2016 | Takai et al. |
| 2016/0276307 A1* | 9/2016 | Lin ................. H01L 21/561 |
| 2016/0338202 A1 | 11/2016 | Park et al. |
| 2017/0133309 A1 | 5/2017 | Kim et al. |

FOREIGN PATENT DOCUMENTS

| | | |
|---|---|---|
| JP | 2015088519 A | 5/2015 |
| JP | 2015523743 A | 8/2015 |
| JP | 2016213466 A | 12/2016 |
| JP | 2017092463 A | 5/2017 |
| WO | 20140171225 A1 | 10/2014 |

OTHER PUBLICATIONS

Written Opinion issued in Application No. PCT/JP2018/044498, dated Feb. 5, 2019.

* cited by examiner

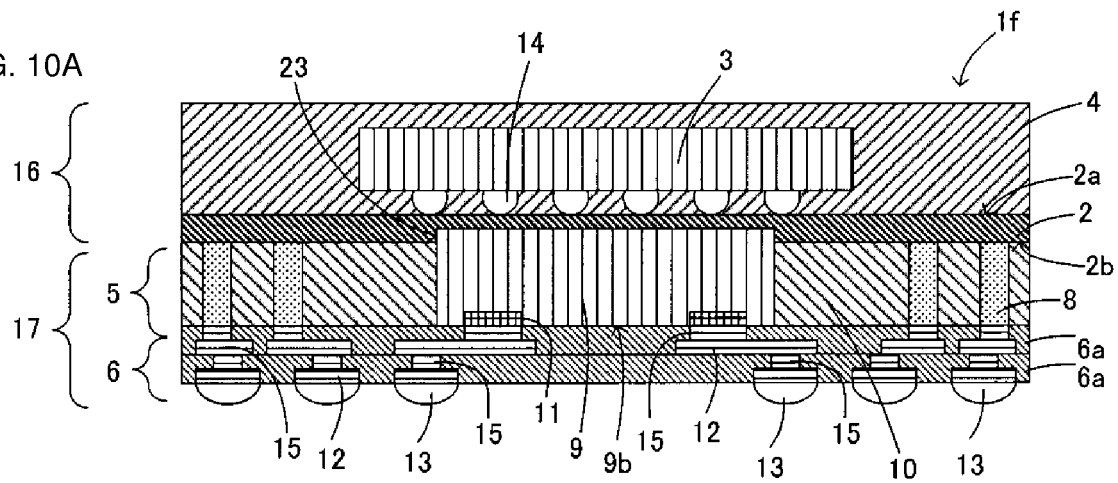
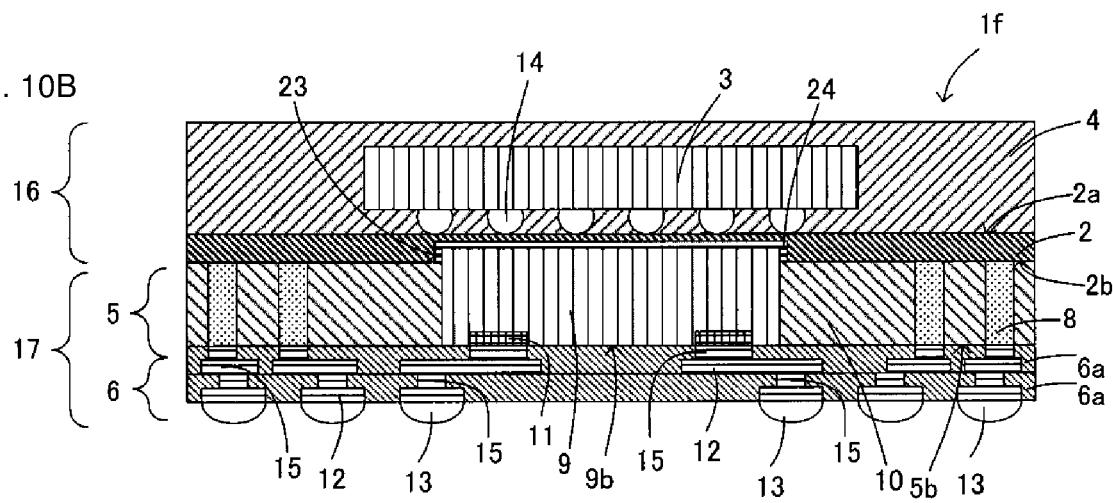
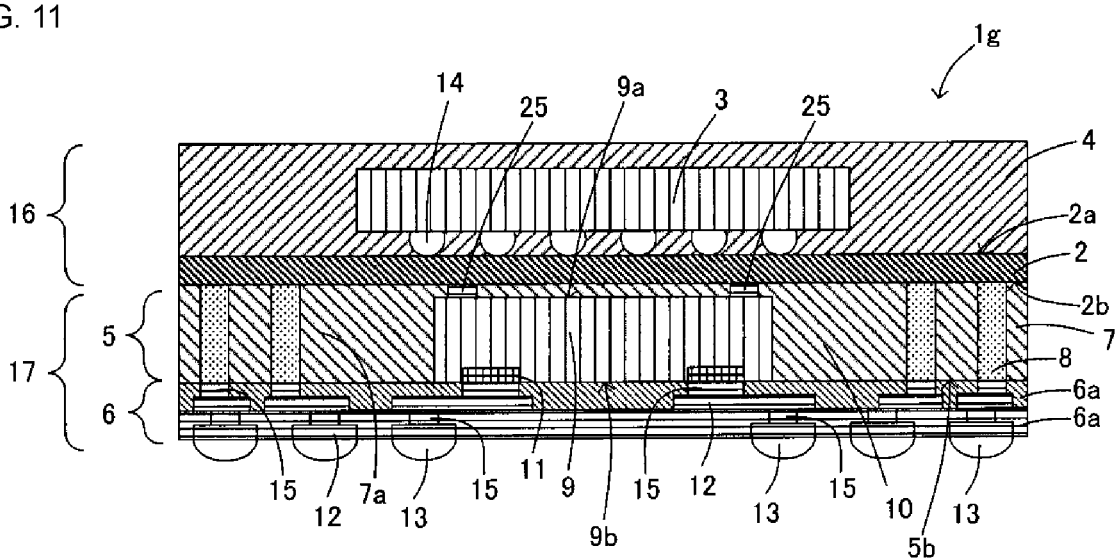

MODULE

This is a continuation of International Application No. PCT/JP2018/044498 filed on Dec. 4, 2018, which claims priority from Japanese Patent Application No. 2017-233390 filed on Dec. 5, 2017. The contents of these applications are incorporated herein by reference in their entireties.

BACKGROUND

Technical Field

The present disclosure relates to a module having a package-on-package structure including a redistribution layer.

In recent years, a module having a redistribution layer formed of a thin film in a component built-in module has been developed. Such a module is called a fan-out type module, and has a structure in which input/output terminals of components built in the module are formed while being enlarged to an outer side portion from an outer shape of the component by the redistribution layer. In this structure, a large number of connection terminals can be provided even in a small size, so that the module can be made thinner, and it is also possible to cope with miniaturization of the components. Further, a fan-out type module having a package-on-package (POP) structure is provided, so that a module having a structure in which a plurality of modules is stacked has been also developed.

As illustrated in FIG. 12, a module 100 described in Patent Document 1 includes a redistribution layer 101, an electronic component 102 arranged on the redistribution layer 101, and a sealing resin layer 103 for sealing the electronic component 102. The electronic component 102 is connected to the redistribution layer 101 by an electrode pad 104, and the electronic component 102 and a mother substrate are electrically connected to each other with a connection terminal 105 interposed therebetween and formed on a lower surface of the redistribution layer 101. Further, a second connection terminal 107 formed on an upper surface of the module 100 and the redistribution layer 101 are connected to each other by a through-wiring 106 formed in the sealing resin layer 103.

Patent Document 1: Japanese Unexamined Patent Application Publication No. 2017-92463 (see paragraphs 0059 to 0062, FIG. 20, FIG. 25, and FIG. 48)

BRIEF SUMMARY

Here, in consideration of further integration, a structure may be considered in which another module is stacked on a top of the module 100 and the components mounted on the stacked modules are connected to the mother substrate. However, in a case where another module is stacked on a module, such as the above-described module 100 including the redistribution layer 101 to form the package-on-package structure, it has been necessary that the module 100 and the module to be stacked on the top are separately formed and then to be connected to each other by bumps. This is because the redistribution layer 101 of the module 100 is formed of a thin film, and it is difficult to achieve flatness of an upper surface 108 of the module 100. Accordingly, a bump, such as the second connection terminal 107 is required on the upper surface 108 of the module 100, so that it is difficult to reduce the height in a case of having the package-on-package structure.

The present disclosure provides a module having a package-on-package structure in which another module can be stacked without necessarily using bumps on a module including a redistribution layer, and which can be easily reduced in height.

A module according to the present disclosure includes a substrate; a first component mounted on one main surface of the substrate; a sealing resin layer for sealing the one main surface and the first component; a second component mounted on another main surface of the substrate; an intermediate layer provided on the other main surface of the substrate and having a plurality of columnar conductors; and in the intermediate layer, a redistribution layer laminated on a surface on an opposite side to the other main surface side of the substrate, in which the first component is connected to the redistribution layer with the columnar conductor interposed between the first component and the redistribution layer, and the second component has an outer electrode on the redistribution layer side, the outer electrode being connected to the redistribution layer.

According to this configuration, since the upper module including the substrate and the first component and the lower module including the intermediate layer and the redistribution layer can be stacked without necessarily using bumps, it is easy to reduce the height when forming the module having a package-on-package structure.

Further, the intermediate layer may include a frame-shaped substrate having an inner peripheral surface formed so as to surround the second component, and a resin may be filled in a cavity surrounded by the inner peripheral surface and the other main surface of the substrate. According to this configuration, by using the frame-shaped substrate in the intermediate layer, it is not necessary to additionally form a via conductor or a columnar conductor in the module on the lower side in the package-on-package structure, and the manufacturing cost can be reduced. Additionally, the resin filled in the cavity is made to have a high heat dissipation property, so that the heat dissipation property with respect to the second component can be improved.

In addition, the frame-shaped substrate and the cavity may be rectangular when viewed from a direction perpendicular to the one main surface of the substrate, and the frame-shaped substrate may have a first groove extending from an outer peripheral surface of the frame-shaped substrate to the inner peripheral surface opposed to the outer peripheral surface, and a second groove positioned on the same line as the first groove.

According to this configuration, warping and distortion due to a difference in coefficient of linear expansion between the substrate and the frame-shaped substrate can be prevented. Further, when the resin is poured into the cavity of the frame-shaped substrate after the substrate and the frame-shaped substrate are bonded to each other, excess resin can be removed through each groove.

Additionally, a shield film may be formed on the inner peripheral surface of the frame-shaped substrate. According to this configuration, it is possible to improve the shielding property and heat dissipation property with respect to the second component.

Additionally, a wiring pattern connected to a ground potential may be provided between the columnar conductors adjacent to each other. According to this configuration, it is possible to improve the shielding property between the first component and the second component. Further, it is possible to improve the shielding property between wirings.

Additionally, a recess may be provided in the other main surface of the substrate, and the second component may be arranged in the recess. According to this configuration, it is possible to prevent the second component from being displaced.

Additionally, the second component may be fixed to the other main surface of the substrate by a metal member provided on the other main surface side of the substrate of the second component. According to this configuration, it is possible to prevent the second component from being displaced.

According to the present disclosure, since no bumps are required when another module is stacked on a module including a redistribution layer, it is possible to provide a module which has a package-on-package structure including a redistribution layer, and which can be easily reduced in height.

BRIEF DESCRIPTION OF THE SEVERAL VIEWS OF THE DRAWINGS

FIGS. 10A and 10B include cross-sectional views of a module according to a fifth embodiment of the present disclosure.

FIG. 11 is a cross-sectional view of a module according to a sixth embodiment of the present disclosure.

DETAILED DESCRIPTION

First Embodiment

Figure 1A:
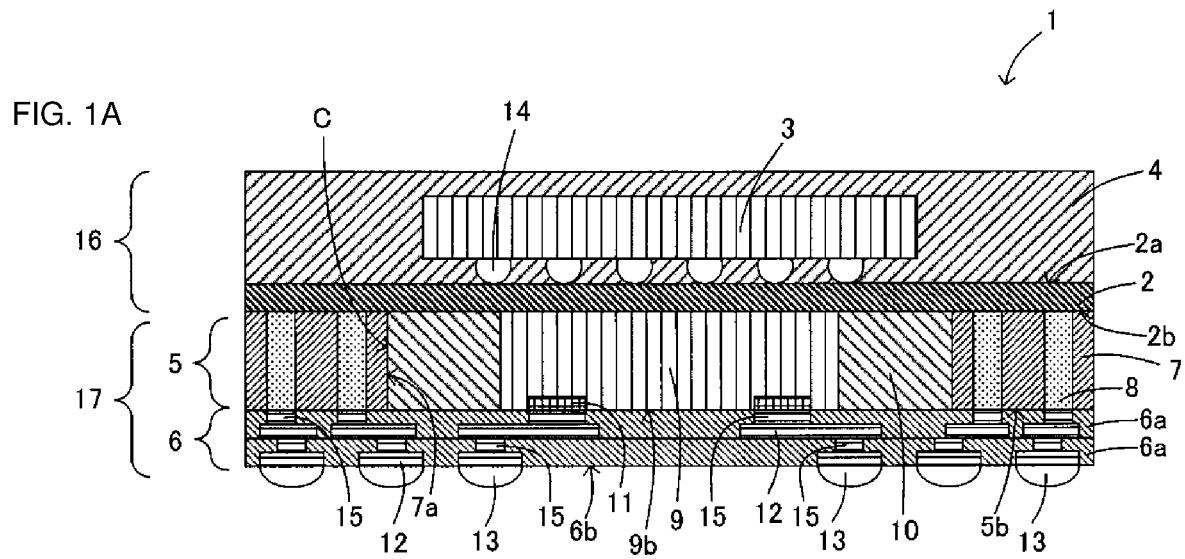
FIGS. 1A and 1B include a cross-sectional view and a plan view of a module according to a first embodiment of the present disclosure.
Figure 1B:
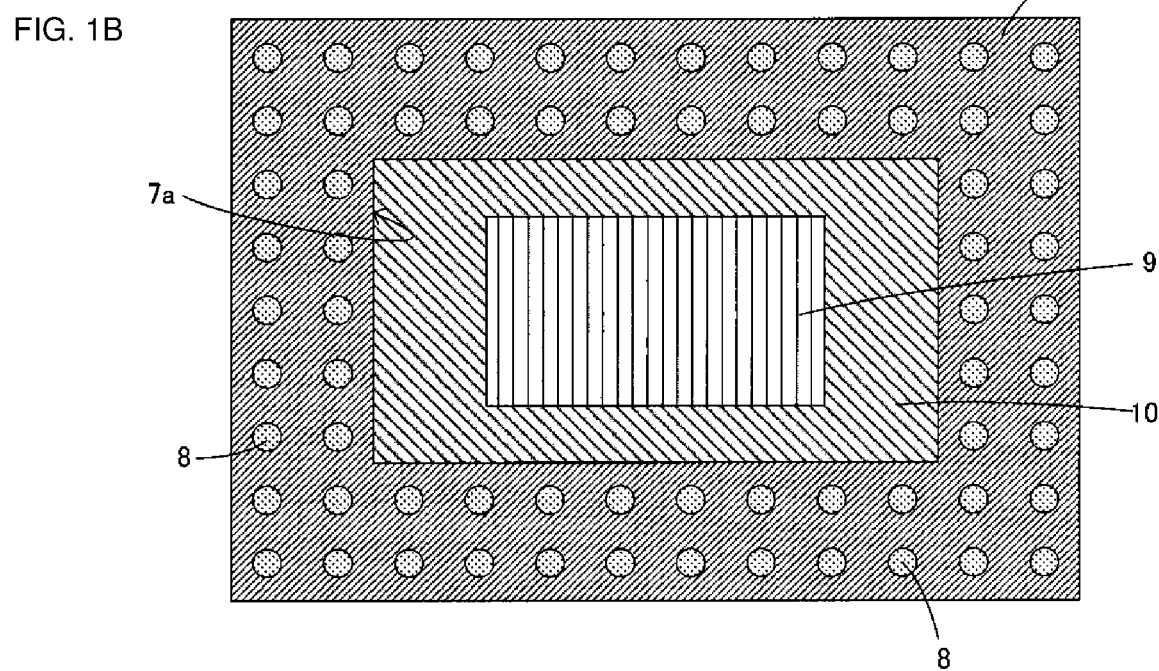

A module 1 according to a first embodiment of the present disclosure will be described with reference to FIG. 1A to FIG. 3C. Note that FIG. 1A is a cross-sectional view of the module 1 according to the first embodiment, and FIG. 1B is a plan view of an intermediate layer of the module 1. FIGS. 2A, 2B, 2C and FIGS. 3A, 3B, 3C are diagrams illustrating a method of manufacturing the module 1.

The module 1 according to the first embodiment is mounted on, for example, a motherboard or the like of an electronic apparatus. As illustrated in FIGS. 1A and 1B, the module 1 includes a substrate 2 in which a first component 3 is mounted on an upper surface 2a (corresponding to "one main surface" of the present disclosure) and a sealing resin layer 4 is laminated, an intermediate layer 5 provided on a lower surface 2b (corresponding to "another main surface" of the present disclosure) of the substrate 2, and a redistribution layer 6 laminated on a lower surface 5b of the intermediate layer 5.

The intermediate layer 5 includes a frame-shaped substrate 7, a columnar conductor 8 formed on the frame-shaped substrate 7, a second component 9 arranged in a region surrounded by an inner peripheral surface 7a of the frame-shaped substrate 7 and mounted on the lower surface 2b of the substrate 2, and a resin portion 10 (corresponding to a "resin" of the present disclosure) filled in a cavity C surrounded by the inner peripheral surface 7a of the frame-shaped substrate 7 and the lower surface 2b of the substrate 2. Further, in the second component 9, an outer electrode 11 formed on a lower surface 9b is connected to a wiring electrode 12 of the redistribution layer 6, whereby an external connection terminal 13 can be arranged at an outer side portion of the second component 9 while shortening a wiring length. Further, also the first component 3 is connected to the wiring electrode 12 of the redistribution layer 6 with a wiring (not illustrated) of the substrate 2 and the columnar conductor 8 which are interposed therebetween, whereby likewise, the external connection terminal 13 can be arranged at an outer side portion of the first component 3. With such a configuration, it is possible to deal with an increase in the number of terminals. Here, the second component 9 "is mounted", which means a state of being come into contact with the lower surface 2b of the substrate 2 directly or indirectly.

The module 1 has a package-on-package structure in which an upper module 16 configured by the substrate 2, the first component 3, and the sealing resin layer 4, and a lower module 17 configured by the intermediate layer 5 and the redistribution layer 6 are vertically coupled to each other.

The substrate 2 is formed of, for example, a low temperature co-fired ceramic material, a glass epoxy resin, or the like. A plurality of land electrodes (not illustrated) is formed on the upper surface 2a and the lower surface 2b of the substrate 2, and a plurality of ground electrodes (not illustrated), a plurality of wiring electrodes (not illustrated), a plurality of via conductors (not illustrated), and the like are formed in a surface layer and an inner layer of the substrate 2. Note that each ground electrode is formed so as to be exposed from a side surface of the substrate 2, for example, and also may be connected to the shield film.

Each land electrode, each ground electrode, and each wiring electrode is formed of a metal commonly employed as an electrode, such as Cu, Ag, Al, or the like. Further, each via conductor is made of a metal, such as Ag or Cu.

Examples of the first component 3 and the second component 9 include components, such as an inductor, a capacitor, an IC, a power amplifier, and the like. A connection terminal (not illustrated) is connected to a land electrode formed on the upper surface 2a of the substrate 2 by using a solder bump 14, whereby the first component 3 is mounted on the upper surface 2a of the substrate 2. Further, the second component 9 is fixed to the lower surface 2b of the substrate 2 with solder paste, an adhesive or the like. Note that the outer electrode 11 of the second component 9 is formed on the lower surface 9b, and is connected to the wiring electrode 12 of the redistribution layer 6 with a connection conductor 15 interposed therebetween.

The sealing resin layer 4 is provided on the substrate 2 so as to cover the upper surface 2a of the substrate 2 and the first component 3. The sealing resin layer 4 may be formed of a resin commonly used as a sealing resin, such as an epoxy resin containing a silica filler. Additionally, in order to increase thermal conductivity, a filler having a high thermal conductivity, such as an alumina filler may be used.

The frame-shaped substrate 7 is a multilayer substrate formed by laminating a plurality of insulating layers made of an insulating material, such as, for example, a low temperature co-fired ceramic or a glass epoxy resin, and has a frame shape. The frame-shaped substrate 7 has an outer shape substantially the same as the shape of the substrate 2, and is mounted on the lower surface 2b of the substrate 2 in a manner such that the second component 9 is positioned in a region surrounded by the inner peripheral surface 7a of the frame-shaped substrate 7. Further, a columnar conductor 8 and various wiring electrodes (not illustrated) are formed inside the frame-shaped substrate 7. Note that the frame-shaped substrate 7 may be a single layer. That is, a connection conductor formed by a via, metal plating, or a metal pin may be formed in the frame-shaped resin molded body.

The columnar conductor 8 is a via conductor made of a metal, such as Cu, Ag, Al, or the like and electrically connects the wiring electrode of the substrate 2 to the wiring electrode 12 of the redistribution layer 6. Note that the columnar conductor 8 may be formed using a metal pin made of a material, such as Cu, a Cu alloy, such as a Cu—Ni alloy, a Cu—Fe alloy, or the like, Fe, Au, Ag, Al, or the like.

The redistribution layer 6 is formed of a multilayer body of a plurality of resin layers 6a, and is laminated on the lower surface 5b of the intermediate layer 5, and a plurality of wiring electrodes 12 and a plurality of connection conductors 15 are formed in each resin layer 6a. The external connection terminal 13 for connecting to an external mother substrate or the like is formed on a lower surface 6b of the resin layer 6a at a lowermost layer of the redistribution layer 6. The first component 3 and the second component 9 are connected to the external connection terminal 13 with each wiring electrode 12, each connection conductor 15, and each columnar conductor 8 interposed therebetween. At this time, the external connection terminal 13 connected to the first component 3 is located at an outer side portion of an outer shape of the first component 3, and the external connection terminal 13 connected to the second component 9 is positioned at an outer side portion of an outer shape of the second component 9. Further, some of the external connection terminals 13 may be located inside the outer shape of the first component 3.

(Manufacturing Method of Module)

Next, a method of manufacturing the module 1 will be described with reference to FIGS. 2A, 2B, 2C and FIGS. 3A, 3B, 3C.

Figure 2A:
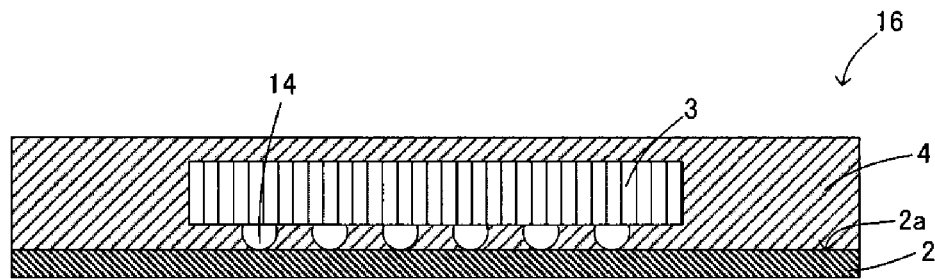
FIGS. 2A, 2B, and 2C include diagrams illustrating a method of manufacturing the module of FIGS. 1A and 1B.

First, as illustrated in FIG. 2A, the upper module 16 is formed. The substrate 2 in which a plurality of land electrodes is formed on the upper surface 2a and the lower surface 2b thereof, and a plurality of ground electrodes, a plurality of wiring electrodes, a plurality of via conductors, and the like are formed in the surface layer or the inner layer is prepared. For each land electrode, each ground electrode, and each wiring electrode, each can be formed by applying a conductive paste containing a metal, such as Cu, Ag, Al, or the like by screen printing or the like, for example, in a case of a low temperature co-fired ceramic substrate. Further, for each via conductor, a via hole is formed by using a laser or the like, and then, the via conductor can be formed by well-known methods.

Next, the first component 3 is mounted on the upper surface 2a of the substrate 2 by using a well-known surface mount technology. For example, the first component 3 is mounted by the solder bump 14, and then a reflow process is performed. Note that, after the reflow process, the substrate 2 may be cleaned. Then, the sealing resin layer 4 is formed so as to cover the first component 3 mounted on the upper surface 2a of the substrate 2. In addition, as the sealing resin layer 4, for example, a transfer molding method, a compression molding method, a liquid resin method, a sheet resin method, or the like can be used. Further, an epoxy resin containing a general silica filler may be used as the sealing resin layer 4. Note that in order to impart high thermal conductivity to the sealing resin layer 4, an epoxy resin containing a filler having a high thermal conductivity, such as an alumina filler may be used. Additionally, after the sealing resin layer 4 is formed, plasma cleaning of the substrate 2 may be performed.

Figure 2B:
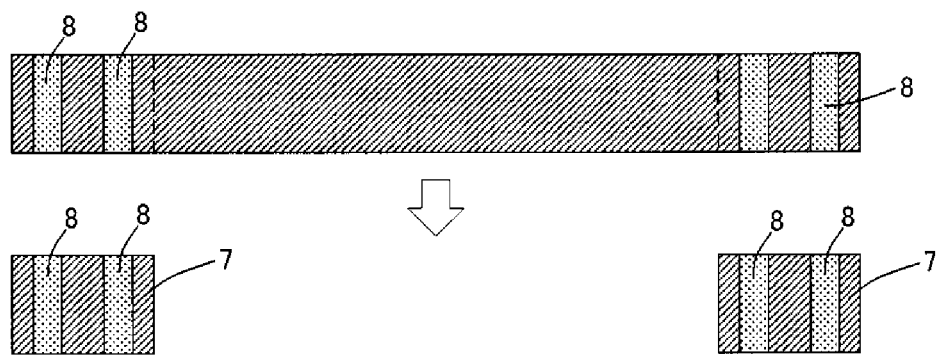
Figure 2C:
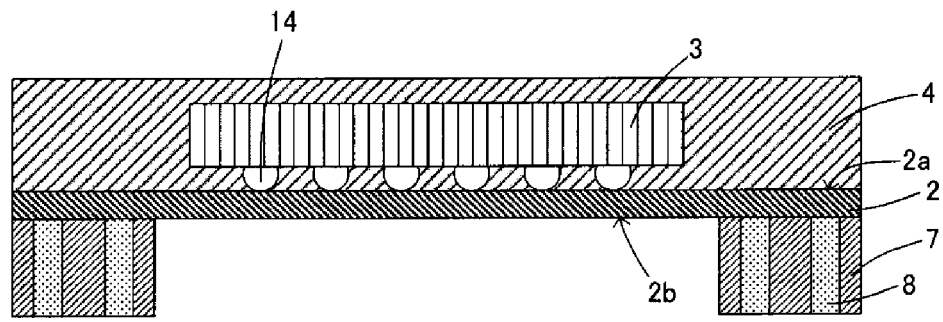

Next, as illustrated in FIG. 2B, the frame-shaped substrate 7 is prepared. The frame-shaped substrate 7 is a multilayer substrate formed by laminating a plurality of insulating layers made of an insulating material, such as a glass epoxy resin or low temperature co-fired ceramic (LTCC), and the frame-shaped substrate 7 which is a frame type substrate is formed by removing a central portion of a rectangular multilayer substrate in which a plurality of columnar conductors 8 is formed. Next, as illustrated in FIG. 2C, the frame-shaped substrate 7 is mounted on the lower surface 2b of the substrate 2 by using a well-known surface mount technology. For example, the frame-shaped substrate 7 can be bonded to the lower surface 2b of the substrate 2 by solder.

Figure 3A:
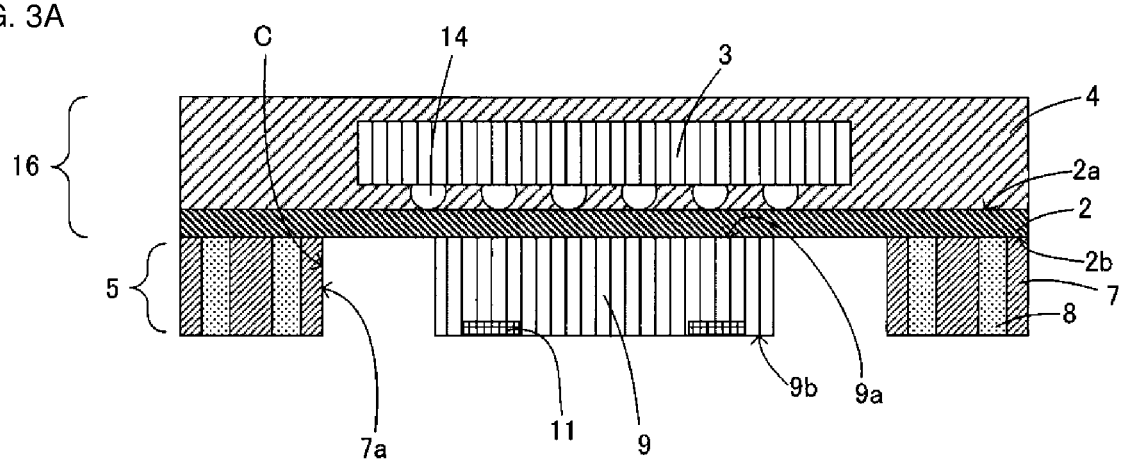
FIGS. 3A, 3B, and 3C include diagrams illustrating a method of manufacturing the module of FIGS. 1A and 1B.
Figure 3B:
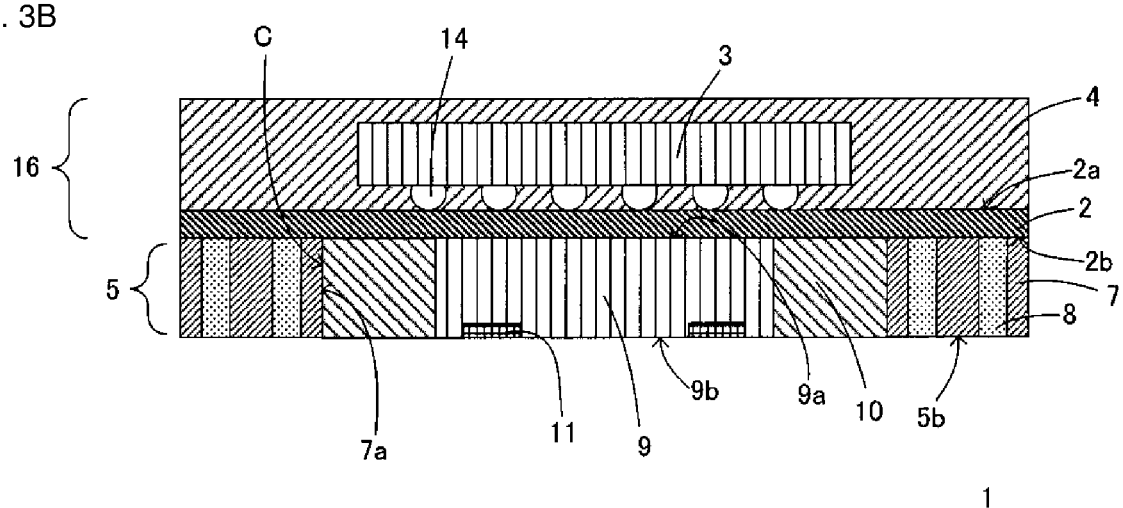

Next, as illustrated in FIG. 3A, the second component 9 is placed on the lower surface 2b of the substrate 2. For example, the lower surface 2b of the substrate 2 and an upper surface 9a of the second component 9 can be bonded by solder paste. Then, as illustrated in FIG. 3B, a thermosetting resin, such as an epoxy resin is filled in the cavity C surrounded by the inner peripheral surface 7a of the frame-shaped substrate 7 and the lower surface 2b of the substrate 2 to form the resin portion 10. Note that the frame-shaped substrate 7 may be mounted after the second component is mounted.

Figure 3C:
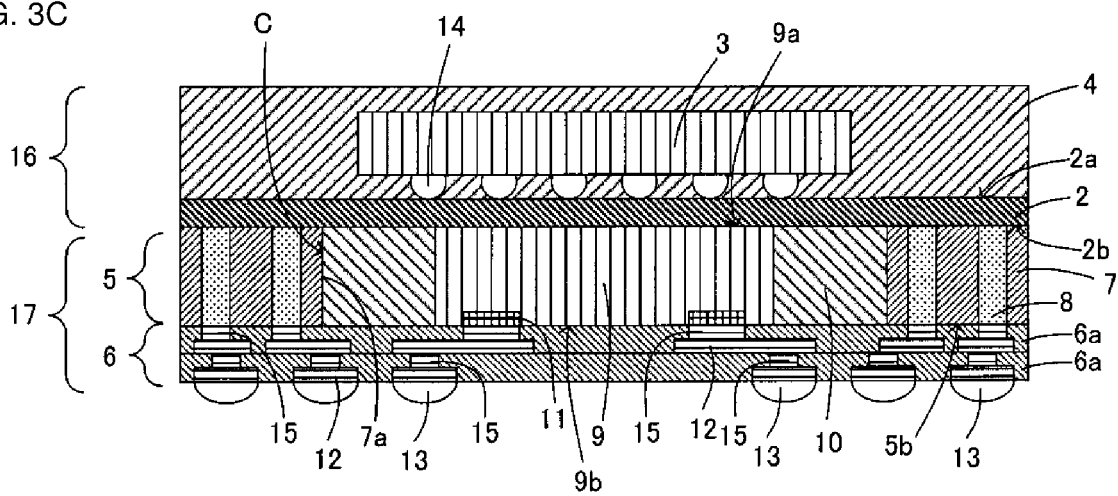

Next, as illustrated in FIG. 3C, the redistribution layer 6 is formed. The redistribution layer 6 is formed by laminating a plurality of resin layers 6a made of polyimide or the like. A plurality of wiring electrodes 12 is formed in each resin layer 6a. Each wiring electrode 12 is formed, for example, by forming a Ti film as a base electrode by sputtering or the like, similarly forming a Cu film on the Ti film by sputtering or the like, and similarly further forming a Cu film by electrolytic or electroless plating on the Cu film. In addition, each wiring electrode 12 is formed in a fine pattern by a photolithography process. Thereafter, the external connection terminal 13 is formed to complete the module 1.

According to the embodiment described above, since the upper module 16 and the lower module 17 can be bonded without necessarily using bumps, a reduction in height can be easily achieved. Further, by using the frame-shaped substrate 7 in the lower module 17, a via conductor and a columnar conductor may be not additionally formed, so that the manufacturing cost can be reduced.

Second Embodiment

A module 1a according to a second embodiment of the present disclosure will be described with reference to FIGS. 4A, 4B and FIGS. 5A, 5B. Note that FIG. 4A is a cross-sectional view of the module 1a according to the second embodiment, FIG. 4B is a plan view of an intermediate layer of the module 1a, and FIGS. 5A and 5B are side views of the module 1a of FIGS. 4A and 4B.

Figure 4A:
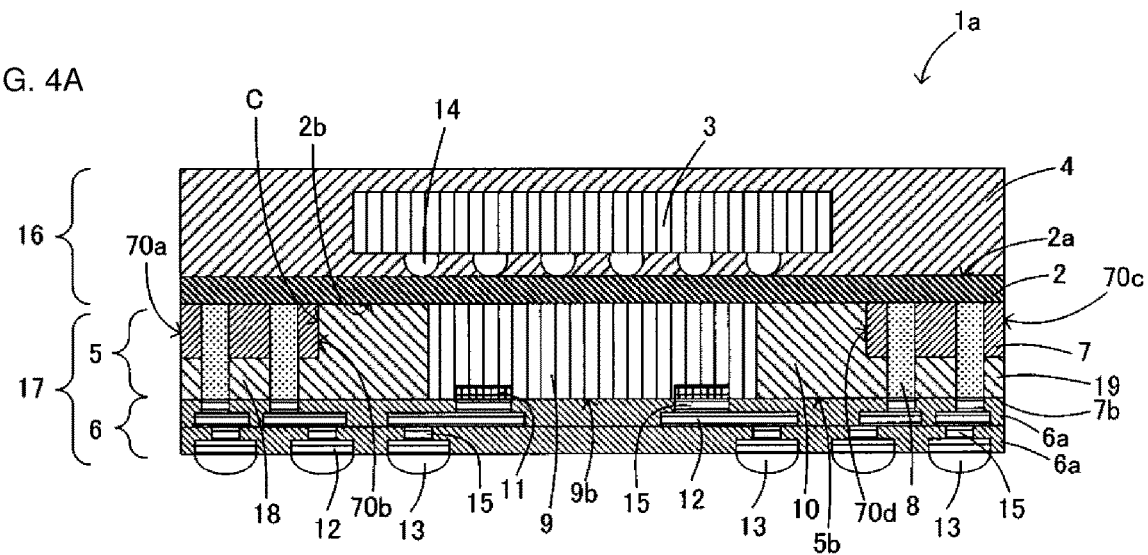
FIGS. 4A and 4B include a cross-sectional view and a plan view of a module according to a second embodiment of the present disclosure.
Figure 4B:
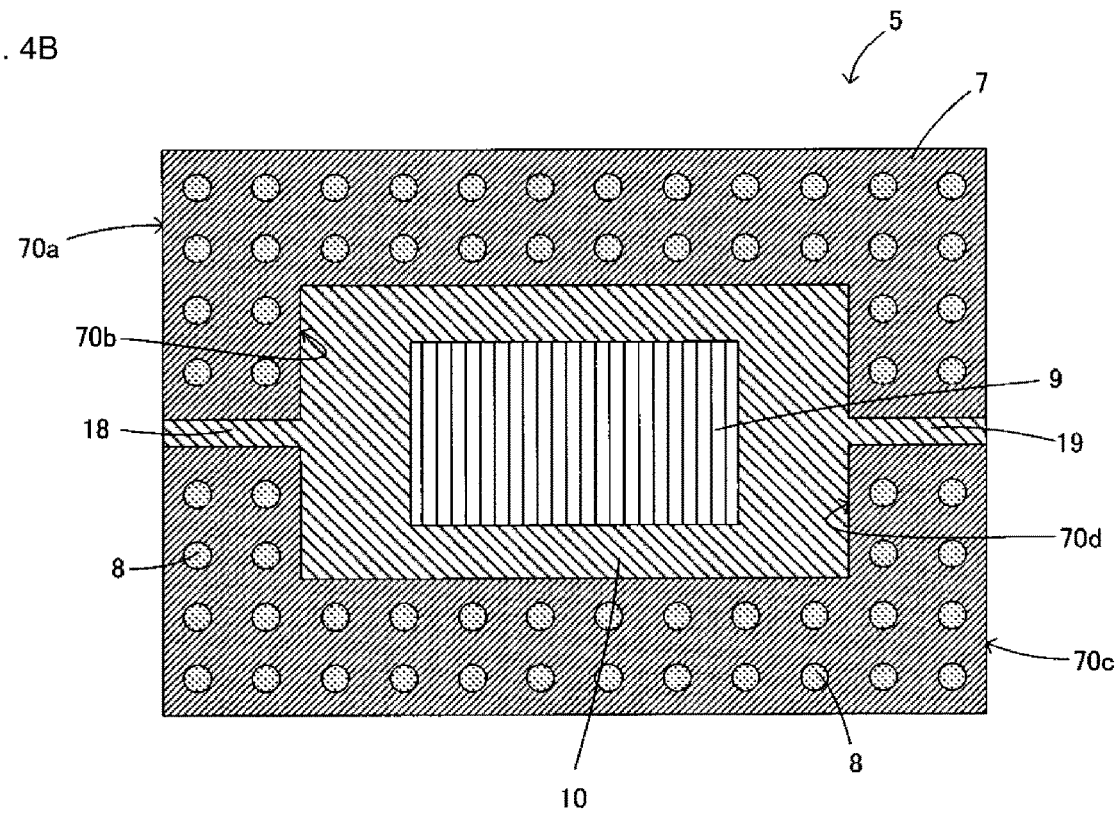
Figure 5A:
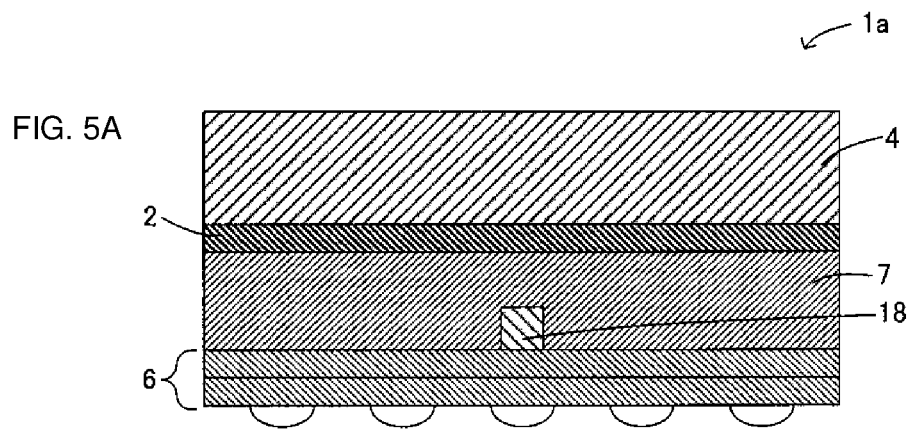
FIGS. 5A and 5B include side views of the module of FIGS. 4A and 4B.
Figure 5B:
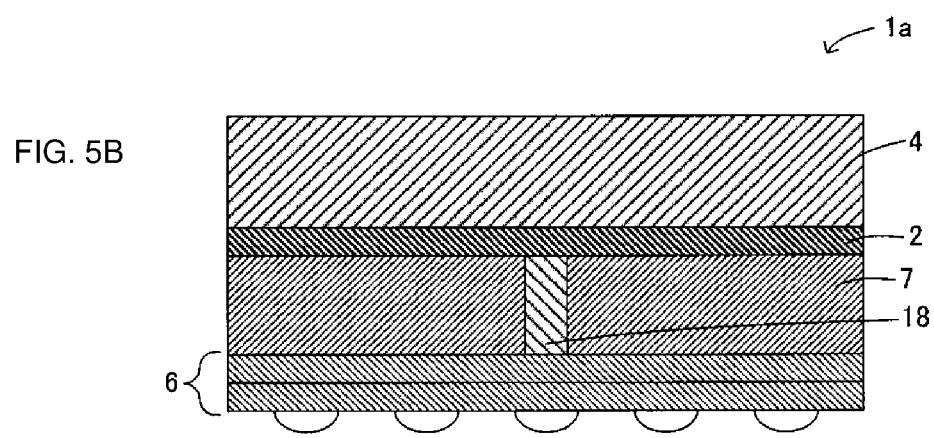

The module 1a according to the second embodiment differs from the module 1 according to the first embodiment described with reference to FIGS. 1A and 1B in that a first groove 18 and a second groove 19 are formed from the resin portion 10 toward an outside of the frame-shaped substrate 7, as illustrated in FIGS. 4A and 4B. Since other configurations are the same as those of the module 1 according to the first embodiment, the same reference numerals are given thereto, whereby description thereof will not be repeated.

As illustrated in FIG. 4B, when viewed from a direction perpendicular to the upper surface 2a of the substrate 2, the first groove 18 is formed on the lower surface 7b side of the frame-shaped substrate 7 while extending from a left outer peripheral surface 70a which is one of the outer peripheral surfaces of the frame-shaped substrate 7 to a left inner peripheral surface 70b which is one of the inner peripheral surfaces of the frame-shaped substrate 7 and is opposed to the left outer peripheral surface 70a. Further, the second groove 19 is likewise formed on the lower surface 7b side of the frame-shaped substrate 7 while extending from a right outer peripheral surface 70c which is opposed to the left outer peripheral surface 70a of the outer peripheral surfaces of the frame-shaped substrate 7 to a right inner peripheral surface 70d which is one of the inner peripheral surfaces of the frame-shaped substrate 7 and is opposed to the right outer peripheral surface 70c.

The first groove 18 and the second groove 19 are formed so as to be positioned substantially on the same line when viewed from a direction perpendicular to the upper surface 2a of the substrate 2. In this way, when the resin is filled in the cavity C, excess resin can be flowed to an outside of the module 1b.

Further, as illustrated in FIG. 5A, each of the grooves 18 and 19 may be formed to be shallower than a height of the frame-shaped substrate 7, or may be formed to have a depth substantially the same as the height of the frame-shaped substrate 7 as illustrated in FIG. 5B.

According to the embodiment described above, when the resin is filled in the cavity C, excess resin can be discharged to the outside of the module 1a. Further, after the lower surface 2b of the substrate 2 of the upper module 16 to which the frame-shaped substrate 7 is bonded is bonded to the second component 9 mounted on the redistribution layer 6 formed in advance, the resin can be filled in the cavity C. Further, by making the resin to be filled in the cavity C be a resin having a high content of a filler having a high heat dissipation property, it is possible to ensure the heat dissipation property of the second component 9.

Third Embodiment

A module 1b according to a third embodiment of the present disclosure will be described with reference to FIGS. 6A and 6B. Note that FIG. 6A is a cross-sectional view of the module 1b according to the third embodiment, and FIG. 6B is a plan view of an intermediate layer of the module 1b.

Figure 6A:
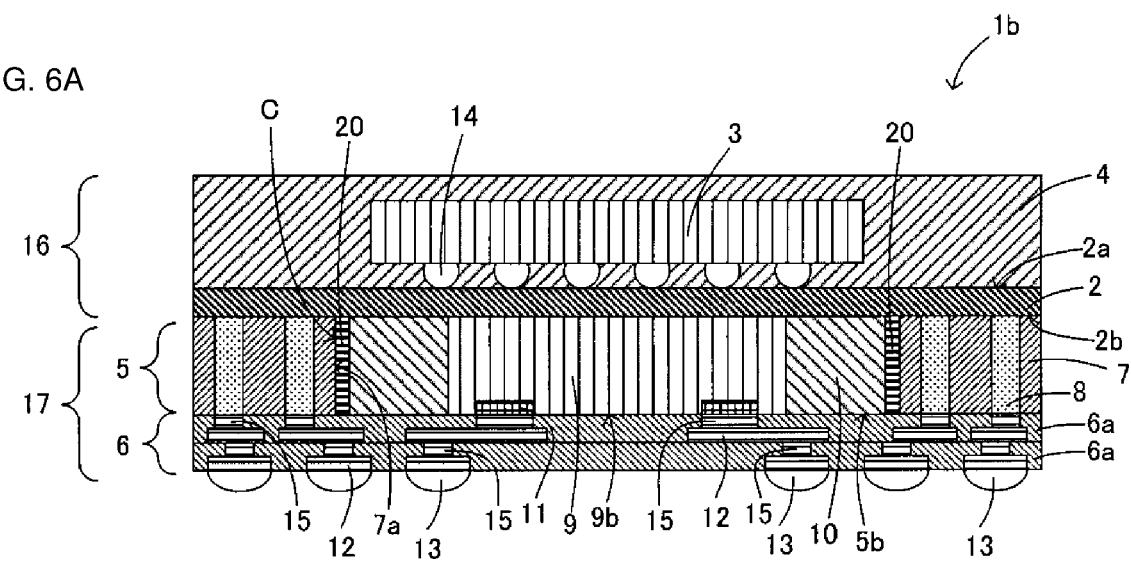
FIGS. 6A and 6B include a cross-sectional view and a plan view of a module according to a third embodiment of the present disclosure.
Figure 6B:
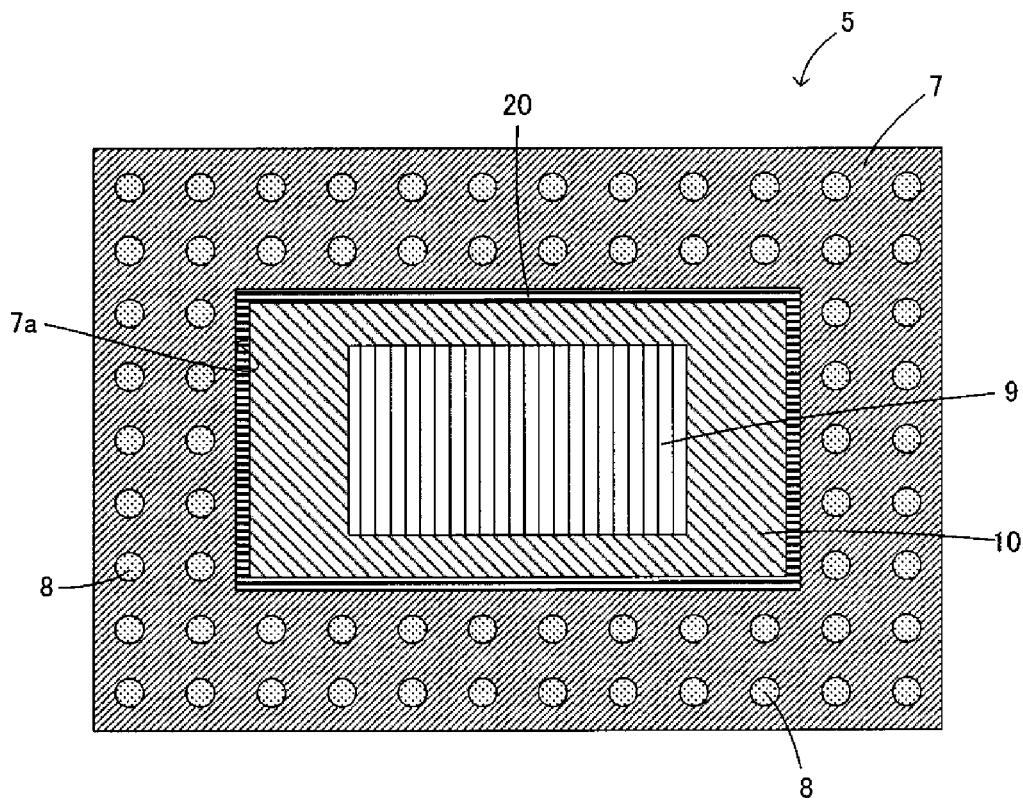

The module 1b according to the third embodiment is different from the module 1 according to the first embodiment described with reference to FIGS. 1A and 1B in that a shield film 20 is formed on the inner peripheral surface 7a of the frame-shaped substrate 7 as illustrated in FIGS. 6A and 6B. Since other configurations are the same as those of the module 1 according to the first embodiment, the same reference numerals are given thereto, whereby description thereof will not be repeated.

As illustrated in FIGS. 6A and 6B, the shield film 20 is formed on the inner peripheral surface 7a of the frame-shaped substrate 7. The shield film 20 serves to block electromagnetic waves from the outside with respect to the second component 9 or electromagnetic waves generated from the second component 9 toward the outside, and is connected to a ground electrode (not illustrated) of the substrate 2. The shield film 20 may be formed to have a multilayer structure including an adhesive film, a conductive film laminated on the adhesive film, and a protective film laminated on the conductive film. The adhesive film may be made of a metal, such as SUS. Moreover, the adhesive film may be made of Ti, Cr, Ni, TiAl, or the like. The conductive film is a layer which performs a substantial shield function of the shield film 20, and may be formed of, for example, a metal of any one of Cu, Ag, and Al. The protective film is provided to prevent corrosion or damage to the conductive film, and may be formed of, for example, SUS. The protective film may be made of Ti, Cr, Ni, TiAl, or the like.

According to the embodiment described above, by providing the shield film 20 formed of a metal on the inner peripheral surface of the frame-shaped substrate 7, heat generated from the second component 9 arranged inside the module 1b can be dissipated. Therefore, it is possible to ensure the shielding property with respect to the second component 9, and at the same time, it is also possible to ensure the heat dissipation property of the module 1b.

(Modification of Shield Film)

A modification of the shield film 20 will be described with reference to FIGS. 7A, 7B and FIGS. 8A and 8B. Note that FIG. 7A is a cross-sectional view of a module 1c, FIG. 7B is a plan view of an intermediate layer of the module 1c, FIG. 8A is a cross-sectional view of a module 1d, and FIG. 8B is a plan view of an intermediate layer of the module 1d.

Figure 7A:
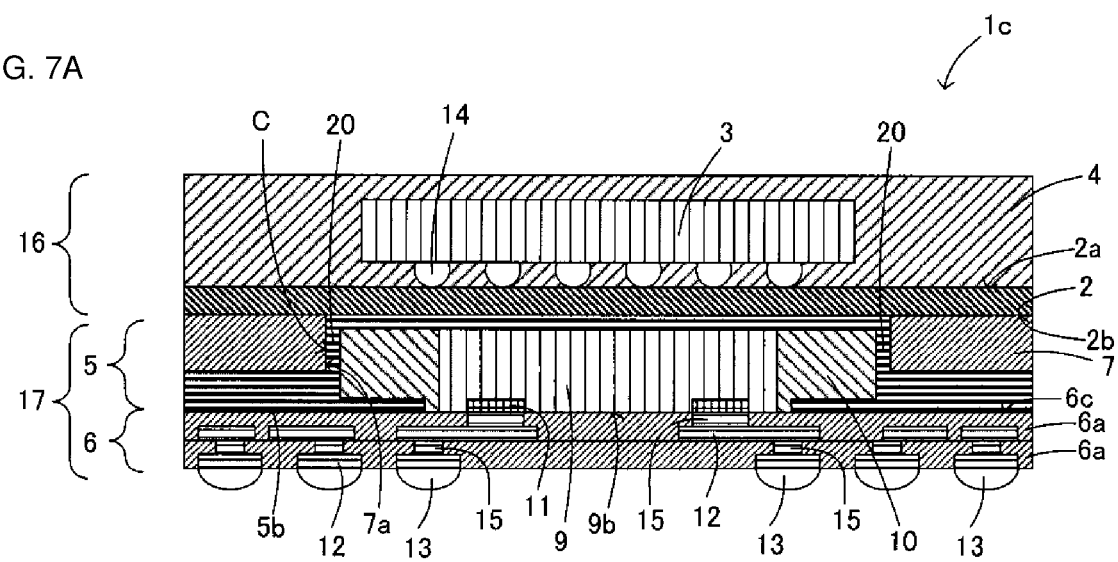
FIGS. 7A and 7B include views illustrating a modification of the module illustrated in FIGS. 6A and 6B.
Figure 7B:
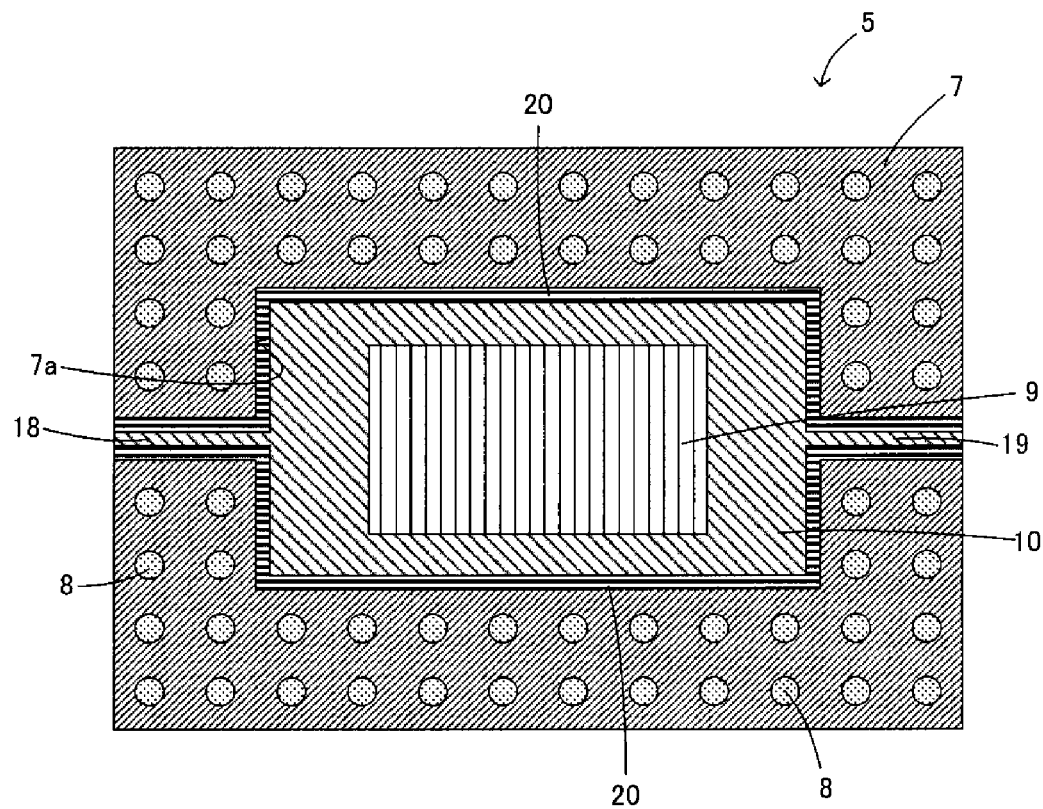

As illustrated in FIGS. 7A and 7B, the frame-shaped substrate 7 has the first groove 18 and the second groove 19, and the shield film 20 is also formed in each of the grooves 18 and 19. Further, by also providing the shield film 20 on the lower surface 2b of the substrate 2 and an upper surface 6c of a resin layer 6a at an uppermost layer of the redistribution layer 6, the heat dissipation property can be further improved. Note that the shield film 20 on the lower surface 2b of the substrate 2 and the upper surface 6c of the resin layer 6a at the uppermost layer of the redistribution layer 6 may be a wiring electrode formed on the lower surface 2b of the substrate 2 and the upper surface 6c of the resin layer 6a at the uppermost layer of the redistribution layer 6.

Figure 8A:
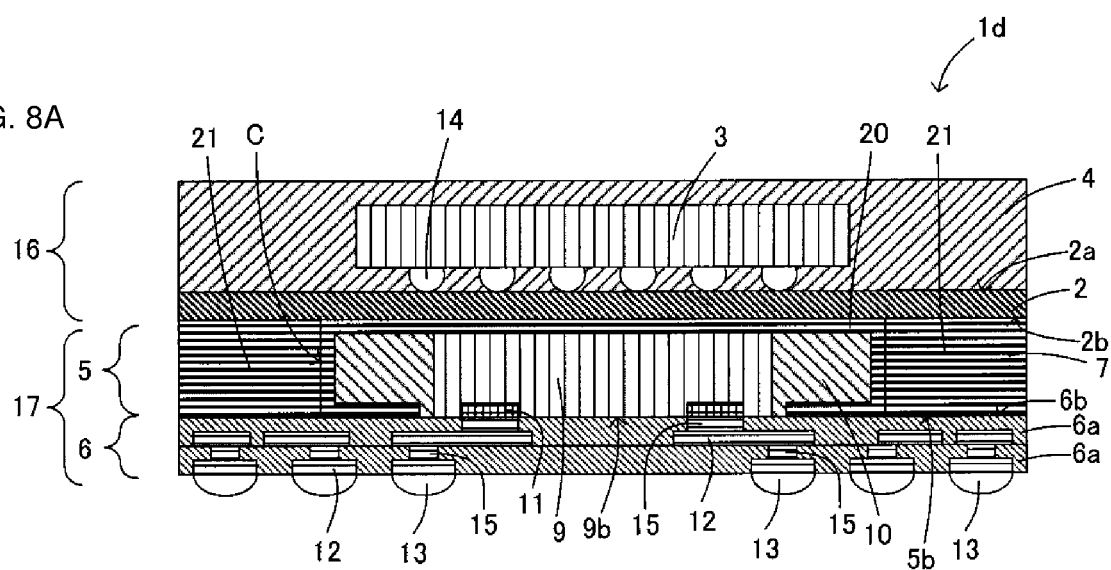
FIGS. 8A and 8B include views illustrating a modification of the module illustrated in FIGS. 6A and 6B.
Figure 8B:
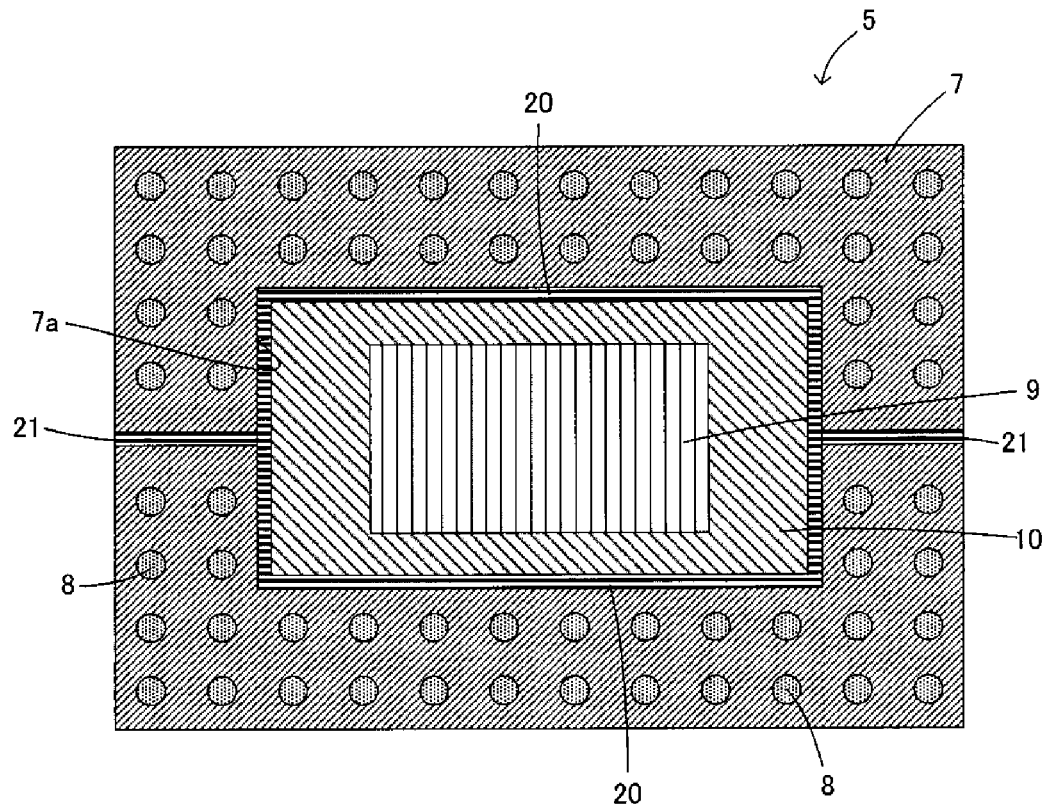

Further, as illustrated in FIGS. 8A and 8B, by connecting a ground electrode 21 formed inside the frame-shaped substrate 7 to the shield film 20, the heat dissipation property can be further improved.

Fourth Embodiment

A module 1e according to a fourth embodiment of the present disclosure will be described with reference to FIG. 9. Note that FIG. 9 is a plan view of the module 1e according to the fourth embodiment.

Figure 9:
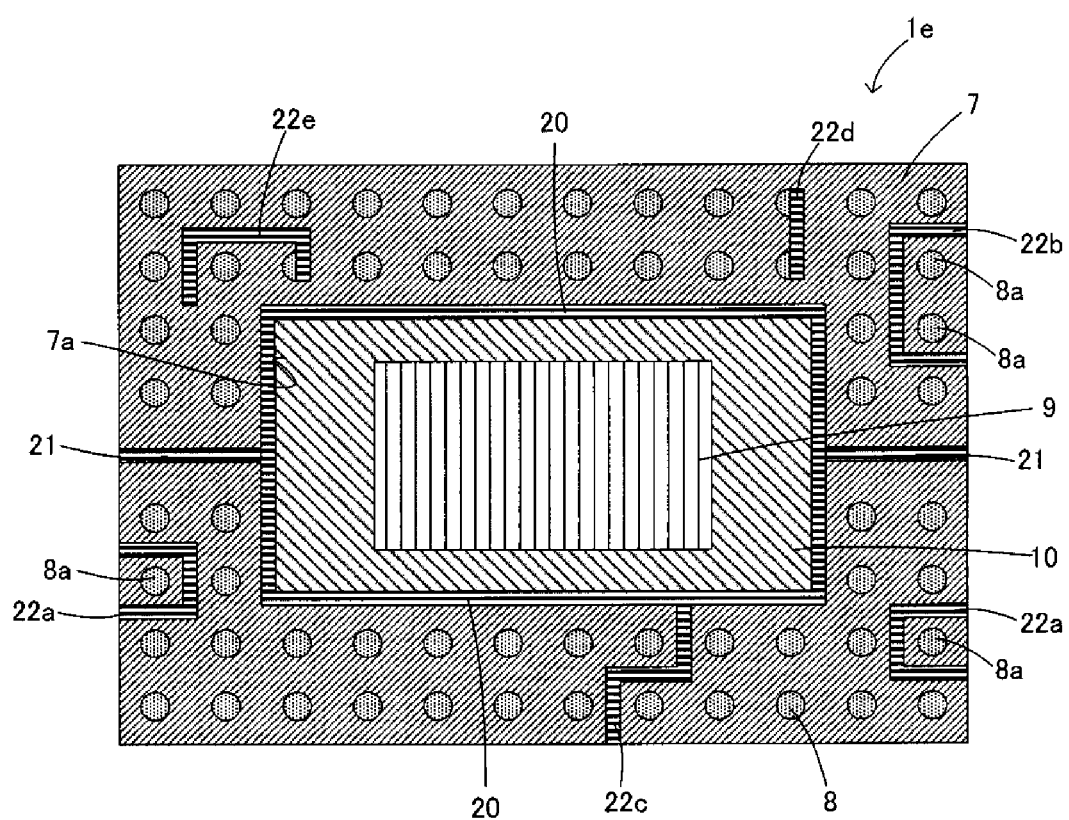
FIG. 9 is a plan view of a module according to a fourth embodiment of the present disclosure.
Figure 12:
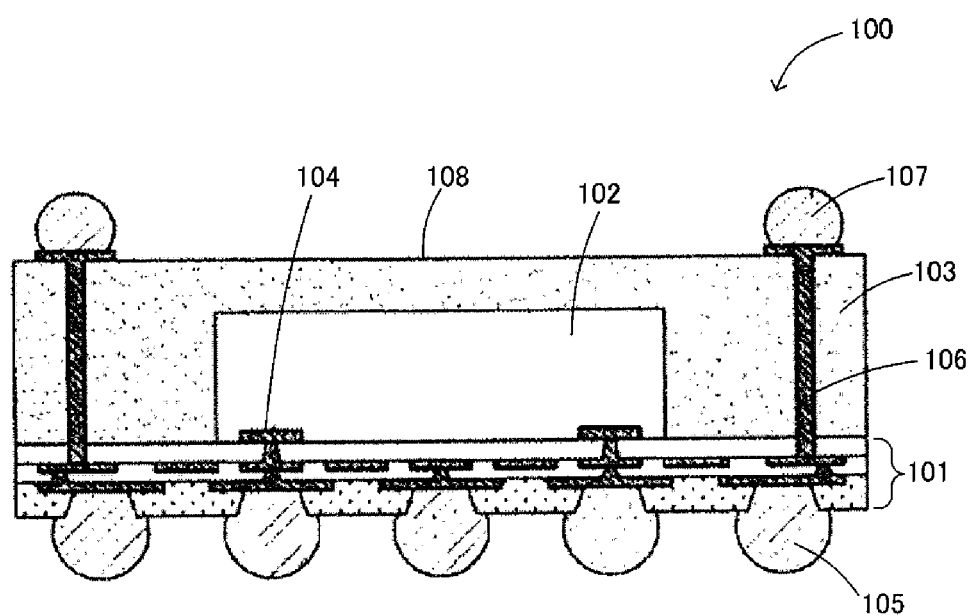
FIG. 12 is a cross-sectional view of an existing module.

The module 1e according to the fourth embodiment differs from the module 1 according to the first embodiment described with reference to FIGS. 1A and 1B in that ground electrodes 22a to 22e which function as a shield are formed inside the frame-shaped substrate 7, as illustrated in FIG. 9. Since other configurations are the same as those of the module 1 according to the first embodiment, the same reference numerals are given thereto, whereby description thereof will not be repeated.

The ground electrodes 22a to 22e (corresponding to the "wiring pattern" in the present disclosure) formed on the frame-shaped substrate 7 are formed between two adjacent columnar conductors 8, and function as a shield between the wirings. For example, like the ground electrode 22a or 22b, the ground electrode may be arranged in a manner such that a predetermined columnar conductor 8a is isolated from the columnar conductor 8 at a circumference thereof. Further, like the ground electrode 22c, the ground electrode may be arranged so as to be connected to the shield film 20. Additionally, like the ground electrode 22d or 22e, the ground electrode may be arranged so as to be connected to the columnar conductor 8. Note that each of the ground electrodes 22a to 22e may be formed in a predetermined layer of the frame-shaped substrate 7, or may be formed so as to penetrate in a thickness direction of the frame-shaped substrate 7.

According to the embodiment described above, the shield is not formed in the redistribution layer 6 in order to ensure a shielding property between wirings of the redistribution layer 6, and the ground electrode is arranged in the frame-shaped substrate 7, so that the shielding property between wirings can be ensured, and a highly reliable module can be provided.

Fifth Embodiment

A module if according to a fifth embodiment of the present disclosure will be described with reference to FIGS. 10A and 10B. Note that FIGS. 10A and 10B are cross-sectional views of the module if according to the fifth embodiment.

The module if according to the fifth embodiment is different from the module 1 according to the first embodiment described with reference to FIGS. 1A and 1B in that, as illustrated in FIGS. 10A and 10B, a recess 23 for fixing the second component 9 is provided on the lower surface 2b of the substrate 2. Since other configurations are the same as those of the module 1 according to the first embodiment, the same reference numerals are given thereto, whereby description thereof will not be repeated.

As illustrated in FIG. 10A, the recess 23 is provided on the lower surface 2b of the substrate 2, and the second component 9 is fitted into the recess 23, so that the second component 9 is fixed to the lower surface 2b of the substrate 2. Further, as illustrated in FIG. 10B, a metal film 24 may be provided in the recess 23. The metal film 24 may be formed using, for example, a metal paste, such as an Ag paste for transferring heat, or a metal foil.

According to the embodiment described above, since the second component 9 is fixed to the recess 23 formed on the lower surface 2b of the substrate 2, further reduction in height can be achieved. Further, by providing the metal film 24 in the recess 23, the heat dissipation property of the second component 9 can be improved.

Sixth Embodiment

A module 1g according to a sixth embodiment of the present disclosure will be described with reference to FIG. 11. Note that FIG. 11 is a cross-sectional view of the module 1g according to the sixth embodiment.

The module 1g according to the sixth embodiment is different from the module 1 according to the first embodiment described with reference to FIGS. 1A and 1B in that a metal portion 25 for fixing the second component 9 and the lower surface 2b of the substrate 2 is provided on the upper surface 9a of the second component 9 as illustrated in FIG. 11. Since other configurations are the same as those of the module 1 according to the first embodiment, the same reference numerals are given thereto, whereby description thereof will not be repeated.

As illustrated in FIG. 11, the metal portion 25 is provided on the upper surface 9a of the second component 9. By connecting the metal portion 25 to an electrode (not illustrated) formed on the lower surface 2b of the substrate 2, the second component 9 is fixed to the lower surface 2b of the substrate 2. The metal portion 25 may be, for example, a bonding material containing a metal component.

According to the embodiment described above, by fixing the second component 9 to the lower surface 2b of the substrate 2 by the metal portion 25, the positional displacement hardly occurs as compared to a case where the solder paste or the adhesive made of resin is used, so that the reliability of the module can be improved.

Note that the present disclosure is not limited to the embodiments described above, and various modifications other than those described above may be made without necessarily departing from the spirit and scope of the present disclosure.

For example, in the embodiment described above, the frame-shaped substrate 7 and the second component 9 are mounted on the lower surface 2b of the substrate 2, and then the resin portion 10 is formed, but a manufacturing method may be adopted such that the second component 9 is arranged at a portion surrounded by the inner peripheral surface of the frame-shaped substrate 7 to form the resin portion 10, and then, the frame-shaped substrate 7, the second component 9, and the resin portion 10 may be integrally mounted on the lower surface 2b of the substrate 2.

In addition, in the embodiment described above, the configuration is adopted in which the intermediate layer 5 has the frame-shaped substrate 7, but the intermediate layer 5 may be configured by the second component 9, the resin portion 10, and the columnar conductor 8, and may not include the frame-shaped substrate 7.

Further, the shield film 20 formed on the inner peripheral surface 7a of the frame-shaped substrate 7 may be connected to the ground electrode formed in the inner layer of the substrate 2.

INDUSTRIAL APPLICABILITY

Further, the present disclosure can be applied to a module having a package-on-package structure including a redistribution layer.

REFERENCE SIGNS LIST 1, 1a to 1g MODULE
2 SUBSTRATE
2a UPPER SURFACE (ONE MAIN SURFACE)
2b LOWER SURFACE (ANOTHER MAIN SURFACE)
3 FIRST COMPONENT
4 SEALING RESIN LAYER
5 INTERMEDIATE LAYER
6 REDISTRIBUTION LAYER
7 FRAME-SHAPED SUBSTRATE
8 COLUMNAR CONDUCTOR
9 SECOND COMPONENT
10 RESIN PORTION (RESIN)
18 FIRST GROOVE
19 SECOND GROOVE
20 SHIELD FILM 22a to 22e GROUND ELECTRODE (WIRING PATTERN)

The invention claimed is:

1. A module comprising:
   a substrate;
   a first component mounted on one main surface of the substrate;
   a sealing resin layer sealing the one main surface and the first component;
   a second component mounted on another main surface of the substrate;
   an intermediate layer provided on the other main surface of the substrate and having a plurality of columnar conductors; and
   a redistribution layer laminated on a surface of the intermediate layer on an opposite side facing to the other main surface of the substrate,
   wherein the first component is connected to the redistribution layer with the columnar conductor interposed between the first component and the redistribution layer,
   the second component has an outer electrode on the redistribution layer side, the outer electrode being connected to the redistribution layer,
   an entire upper surface of the second component is in direct contact with the another main surface of the substrate, and
   a height of a side surface of the second component is same as the height of the columnar conductors.

2. The module according to claim 1, wherein the intermediate layer includes a frame-shaped substrate having an inner peripheral surface provided to surround the second component, and a resin is filled in a cavity surrounded by the inner peripheral surface, the second component, the redistribution layer, and the other main surface of the substrate.

3. The module according to claim 2,
   wherein the frame-shaped substrate and the cavity are rectangular when viewed from a direction perpendicular to the one main surface of the substrate, and
   the frame-shaped substrate has, when viewed from the direction perpendicular to the one main surface of the substrate, a first groove extending from an outer peripheral surface of the frame-shaped substrate to the inner peripheral surface opposed to the outer peripheral surface and a second groove positioned on a same line as the first groove.

4. The module according to claim 3, wherein a shield film is provided on the inner peripheral surface of the frame-shaped substrate.

5. The module according to claim 3, wherein a wiring pattern connected to a ground potential is provided between the columnar conductors adjacent to each other.

6. The module according to claim 3, wherein a recess is provided in the other main surface of the substrate, and the second component is arranged in the recess.

7. The module according to claim 3, wherein the second component is fixed to the other main surface of the substrate by a metal member provided on the other main surface of the substrate of the second component.

8. The module according to claim 2, wherein a shield film is provided on the inner peripheral surface of the frame-shaped substrate, and wherein the shield film is in direct contact with the redistribution layer, the another main surface of the substrate, and an entire upper surface of the second component.

9. The module according to claim 8, wherein a wiring pattern connected to a ground potential is provided between the columnar conductors adjacent to each other.

10. The module according to claim 8, wherein a recess is provided in the other main surface of the substrate, and the second component is arranged in the recess.

11. The module according to claim 8, wherein the second component is fixed to the other main surface of the substrate by a metal member provided on the other main surface of the substrate of the second component.

12. The module according to claim 8, wherein the shield film is a multilayer structure comprising an adhesive film that is in direct contact with the inner peripheral surface of the frame-shaped substrate, a conductive film laminated on the adhesive film, and a protective film laminated on the conductive film.

13. The module according to claim 8, wherein the adhesive film comprises SUS, Ti, Cr, Ni, Ti, Al, or combinations thereof, the conductive film comprises Cu, Ag, Al, or combinations thereof, and the protective film comprises SUS, Ti, Cr, Ni, TiAl, or combinations thereof.

14. The module according to claim 2,
   wherein the frame-shaped substrate and the cavity are rectangular when viewed from a direction perpendicular to the one main surface of the substrate, and
   the frame-shaped substrate has, when viewed from the direction perpendicular to the one main surface of the substrate, a first groove extending from an outer peripheral surface of the frame-shaped substrate to the inner peripheral surface and a second groove extending from another outer peripheral surface to another inner peripheral surface, the first groove and the second groove are on a same line when viewed from the direction perpendicular to the one main surface of the substrate.

15. The module according to claim 2, wherein a wiring pattern connected to a ground potential is provided between the columnar conductors adjacent to each other.

16. The module according to claim 2, wherein a recess is provided in the other main surface of the substrate, and the second component is arranged in the recess.

17. The module according to claim 2, wherein the second component is fixed to the other main surface of the substrate by a metal member provided on the other main surface of the substrate of the second component.

18. The module according to claim 1, wherein a wiring pattern connected to a ground potential is provided between the columnar conductors adjacent to each other.

19. The module according to claim 18, wherein a recess is provided in the other main surface of the substrate, and the second component is arranged in the recess.

20. The module according to claim 18, wherein the second component is fixed to the other main surface of the substrate by a metal member provided on the other main surface of the substrate of the second component.

21. The module according to claim 1, wherein a recess is provided in the other main surface of the substrate, and the second component is arranged in the recess.

22. The module according to claim 1, wherein the second component is fixed to the other main surface of the substrate by a metal member provided on the other main surface of the substrate of the second component.

* * * * *

UNITED STATES PATENT AND TRADEMARK OFFICE
CERTIFICATE OF CORRECTION

PATENT NO. : 11,322,472 B2
APPLICATION NO. : 16/892352
DATED : May 3, 2022
INVENTOR(S) : Yoshihito Otsubo et al.

It is certified that error appears in the above-identified patent and that said Letters Patent is hereby corrected as shown below:

In the Specification

Column 9, Line 26, "if" should be -- 1f --.

Column 9, Line 29, "if" should be -- 1f --.

Column 9, Line 31, "if" should be -- 1f --.

Signed and Sealed this
Twenty-eighth Day of February, 2023

Katherine Kelly Vidal
*Director of the United States Patent and Trademark Office*